United States Patent [19]

Musaka et al.

[11] Patent Number: 5,571,571
[45] Date of Patent: Nov. 5, 1996

[54] METHOD OF FORMING A THIN FILM FOR A SEMICONDUCTOR DEVICE

[75] Inventors: Katsuyuki Musaka, Sakae; Shinzuke Mizuno, Narita, both of Japan

[73] Assignee: Applied Materials, Inc., Santa Clara, Calif.

[21] Appl. No.: 259,584

[22] Filed: Jun. 14, 1994

Related U.S. Application Data

[63] Continuation-in-part of Ser. No. 184,331, Jan. 19, 1994, abandoned.

[30] Foreign Application Priority Data

Jun. 16, 1993 [JP] Japan ..................... 5-145070

[51] Int. Cl.⁶ .................. H05H 1/02; H05H 1/30; H05H 1/24
[52] U.S. Cl. .................. 427/574; 427/563; 427/575; 427/579
[58] Field of Search .................. 427/563, 574, 427/578, 579, 575

[56] References Cited

U.S. PATENT DOCUMENTS

| | | | |
|---|---|---|---|
| 4,282,267 | 8/1981 | Küyel | 427/563 |
| 4,461,783 | 7/1984 | Yamazaki | 427/563 |
| 4,668,365 | 5/1987 | Foster et al. | 204/192.23 |
| 4,778,721 | 10/1988 | Sliemers et al. | 427/578 |
| 4,818,563 | 4/1989 | Ishihara et al. | 427/574 |
| 4,872,947 | 10/1989 | Wang et al. | 427/574 |
| 4,894,352 | 1/1990 | Lane et al. | 437/238 |
| 5,013,691 | 5/1991 | Lory et al. | 437/238 |
| 5,206,060 | 4/1993 | Balian et al. | 427/578 |
| 5,223,457 | 6/1993 | Mintz et al. | 427/574 |
| 5,275,977 | 1/1994 | Otsubo et al. | 437/228 |
| 5,286,518 | 2/1994 | Cain et al. | 427/574 |
| 5,288,518 | 2/1994 | Homma | 427/574 |
| 5,356,722 | 10/1994 | Nguyen et al. | 427/574 |
| 5,429,995 | 7/1995 | Nishiyama et al. | 427/563 |
| 5,462,899 | 10/1995 | Ikeda | 427/563 |
| 5,492,736 | 2/1996 | Laxman et al. | 427/579 |

FOREIGN PATENT DOCUMENTS

| | | | |
|---|---|---|---|
| 573911 | 12/1993 | European Pat. Off. | H01L 21/314 |
| 92/20833 | 11/1992 | WIPO | C23C 16/00 |

OTHER PUBLICATIONS

Abstract of JP63062238 from Patent Abstracts of Japan vol. 12, No. 285 (E–642) published Mar. 1988 to Tsunetoshi et al.
Webb et al, "Silicon Dioxide Films produced . . ." Oric, 2nd Int'l ULSI Conf. 1989 No month.
Yu et al "Step Coverage Study of PETEOS . . . " VMIC Conf. 1990 IEEE, Jun. 12–13, 1990.

Primary Examiner—Marianne Padgett
Attorney, Agent, or Firm—Birgit E. Morris; Michael B. Einschlag

[57] ABSTRACT

A method of forming conformal, high quality silicon oxide films that can be deposited over closely spaced, submicron lines and spaces without the formation of voids, comprises forming a plasma of TEOS and a selected halogen-containing gas in certain ratios. By proper control of the energy sources that create the plasma, the proper selection of the halogen-containing gas and selection of other processing parameters, high deposition rates can also be achieved.

10 Claims, 9 Drawing Sheets

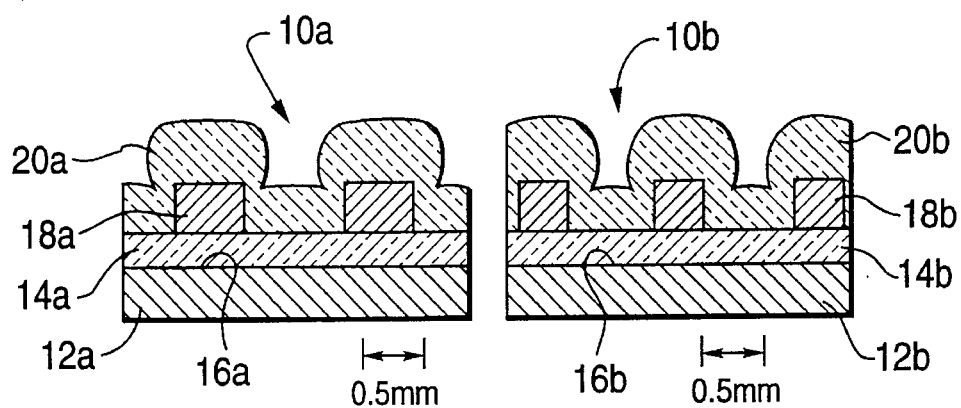
FIG. 1A
PRIOR ART
FIG. 1B
PRIOR ART
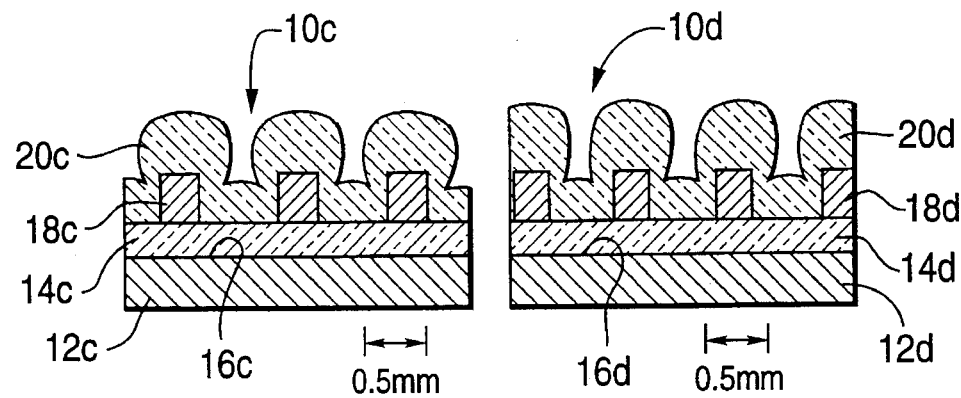
FIG. 1C
PRIOR ART
FIG. 1D
PRIOR ART
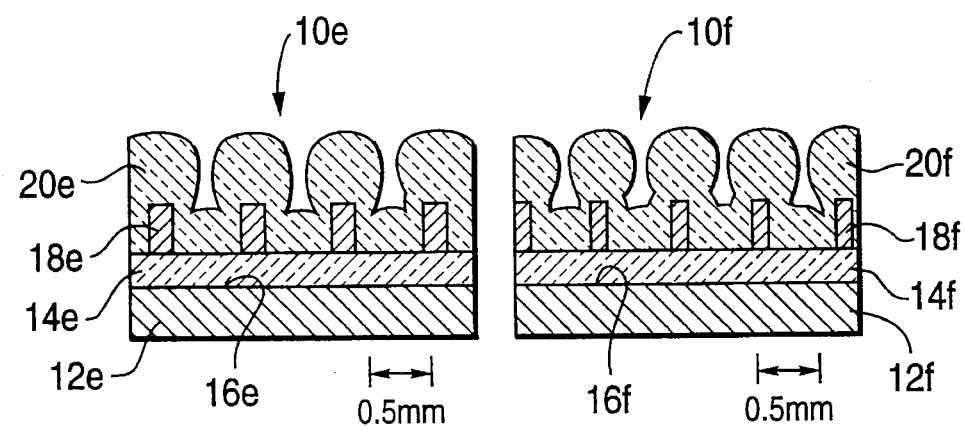
FIG. 1E
PRIOR ART
FIG. 1F
PRIOR ART

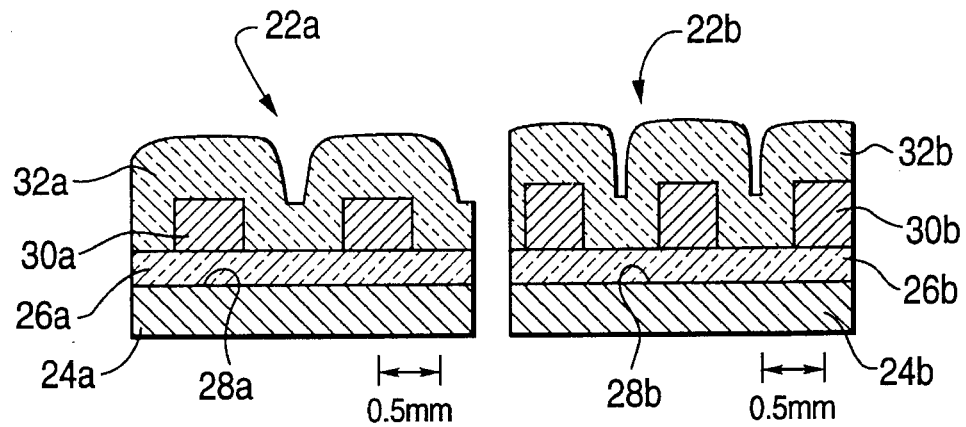
FIG. 2A
PRIOR ART
FIG. 2B
PRIOR ART
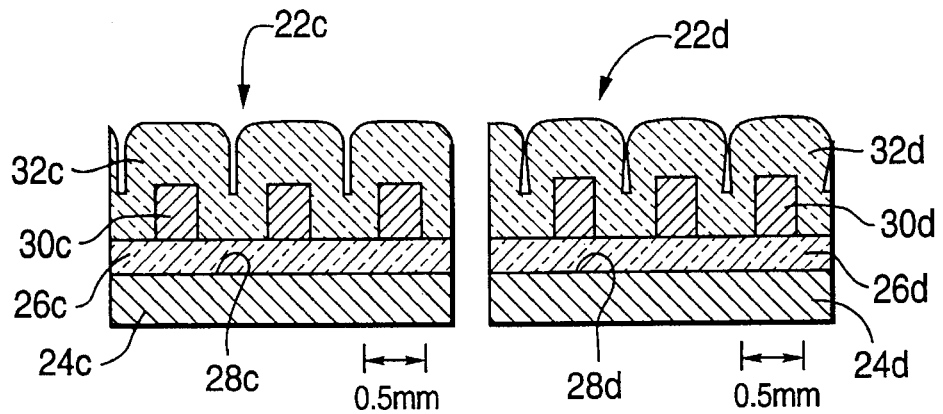
FIG. 2C
PRIOR ART
FIG. 2D
PRIOR ART
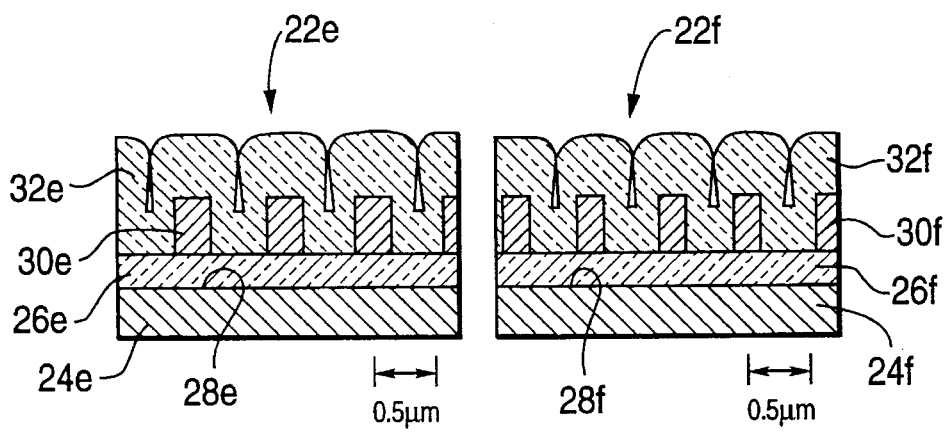
FIG. 2E
PRIOR ART
FIG. 2F
PRIOR ART

METHOD OF FORMING A THIN FILM FOR A SEMICONDUCTOR DEVICE

This application is a continuation-in-part of application Ser. No. 08/184,331 filed Jan. 19, 1994, now abandon, entitled "A METHOD OF FORMING A THIN FILM FOR A SEMICONDUCTOR DEVICE".

The present invention relates to a method of forming a thin film for a semiconductor device. More particularly, this invention relates to a plasma-enhanced chemical vapor deposition (hereinafter PECVD) method for forming a silicon oxide thin film on a semiconductor substrate.

BACKGROUND OF THE INVENTION

PECVD provides a well known method of depositing a thin film. A body is placed in a vacuum reaction chamber and a reaction gas is introduced into the chamber. The gas is activated by means of a plasma discharge created in the chamber. This causes the reaction gas to react and deposit a thin film of a material on the surface of the body.

The methods of creating a plasma in the reaction chamber for PECVD include the method in which an electric power source having a frequency of 13.56 MHz or other frequency is applied to a pair of opposed electrodes within the reaction chamber. The deposition rate and the quality of the deposited thin film can be controlled by adjusting the power of this electric power source. Another method of creating a plasma in a reaction chamber uses a microwave radiation of 1.54 GHz, introduced into the reaction chamber by means of a wave guide. This method is known as ECR plasma CVD. Gases used to deposit a thin film of silicon oxide on a semiconductor substrate include alkoxy silicates such as tetraethylorthosilicate, $(C_2H_5O)_4$—Si, (hereinafter TEOS) and silane, $SiH_4$.

With the recent development of high density semiconductor integrated circuit devices (VLSI devices) there has been created an urgent need for techniques that can create ultrafine configurations in the submicron range. In order to respond to this demand, the possibility of using conventional techniques to create submicron configurations was considered by conducting an empirical study on the configuration of thin films produced by conventional plasma-enhanced CVD methods.

Each of FIGS. 1A to 1F, 2A to 2F and 4A to 4F are cross sectional views of tracings made of the outlines shown in microphotographs of the longitudinal configurations of actual devices, with the height and width of the devices being indicated by the unit scale in the figures.

Referring to FIGS. 1A to 1F, there are shown sectional views of semiconductor devices 10a to 10f, each comprising a substrate 12a to 12f having a layer 14a to 14f of an insulating material, such as silicon oxide, on a surface 16a to 16f thereof. A plurality of spaced, parallel lines 18a to 18f of a conductive material, such as aluminum, are on the insulating layers 14a to 14f, and are in turn coated with a layer 20a to 20f of an insulating material, such as silicon oxide. The conductive strips 18a to 18f have different widths, strip 18a being the widest and strip 18f being the narrowest. In addition, the spacing between the conductive strips 18a to 18f varies as well, the strips 18a being spaced apart the greatest distance and the strips 18f being spaced apart the closest distance. The insulating coatings 20a to 20f were formed by conventional PECVD wherein a reaction gas of silane (50 sccm) and oxygen at a flow rate one-tenth that of silane was passed into a reaction chamber held at a pressure of 3 Torr. A single 13.56 MHz frequency electric power source between a pair of opposing electrodes spaced 180 mils apart in the chamber was used to form a plasma between the electrodes.

As can be seen in FIGS. 1A to 1F, the sidewalls of the spaces in the silicon oxide coatings 20a to 20f have rounded edges and are thicker over the aluminum strips 18a to 18f than between the aluminum strips 18a to 18f. Thus variously shaped gaps are formed in the silicon oxide coatings 20a to 20f. As the width of the aluminum strips 18a to 18f become narrower, and the spacing between the aluminum strips 18a to 18f also become narrower, irregularly shaped sidewalls are formed and the gaps in the silicon oxide coating 20a to 20f vary in width. In particular, the gaps are narrower at the center of the sidewalls than at the bottom of the sidewalls. This leads to the formation of voids in the coatings 20 as the gaps are filled in. It is believed that because silane is very reactive, the oxidation reaction occurs in the gaseous phase, producing the non-uniform, poor deposition profiles seen in FIGS. 1A to 1F. Thus the use of silane as the reaction gas for deposition of silicon oxide films over conductive metal lines has severe limitations as devices on a semiconductor substrate become smaller and more devices are produced on a single substrate.

FIGS. 2A to 2F illustrate a cross sectional view of semiconductor devices 22a to 22f, similar to those of the semiconductor devices 10a to 10f of FIGS. 1A to 1F. The semiconductor devices 22a to 22f comprise a substrate 24a to 24f of a semiconductor material, such as silicon, having a layer 26a to 26f of an insulating material thereon, such as silicon oxide, on a surface 28a to 28f thereof. A plurality of spaced parallel strips 30a to 30f of a conductive material, such as aluminum, are deposited on the insulating layers 26a to 26f. The conductive strips 30a to 30f are in turn coated with a layer 32a to 32f of an insulating material such as silicon oxide. The conductive strips 30a to 30f have different widths, the conductive strip 30a being the widest, and 30f being the narrowest. Also the spacing between the conductive strips 30a to 30f varies, the spacing between the conductive strips 30a being the widest and the spacing between the conductive strips 30f being the narrowest.

In FIGS. 2A to 2F, the insulating layers 32a to 32f were formed by PECVD using TEOS as the reactive gas, and a single 13.56 MHz power source. As can be seen from FIGS. 2A to 2F, the sidewalls of the silicon oxide deposit are less rounded than those shown in Fig, although the gaps between the openings in the silicon oxide layers 32a to 32f narrow as the conductive strips 30a to 30f become narrower and the spacing between them becomes narrower. Thus the use of TEOS to form silicon oxide films has advantages over the use of silane for small features. However, these films finally also form voids, particularly when the spacing between the strips 30a to 30f is less than 0.5 micron, see layers 32d to 32f. Thus although the deposition profile is much more uniform that the profiles of FIGS. 1A to 1F using silane as the precursor gas, as the aluminum lines become narrower and closer together, voids are formed in the growing film. Thus the use of TEOS to grow silicon oxide films over stepped topography is also limited, and is inadequate for submicron lines and spaces as shown particularly in FIGS. 2D to 2F.

Thus it would be desirable to be able to deposit silicon oxide films over conductive lines that are spaced closer than 0.5 micron, but that do not form voids in the layer. Further, it is desired to improve the quality of the silicon oxide films.

Other prior art workers have addressed this problem. Foster et al, U.S. Pat. No. 4,667,365 and assigned to the same assignee as the present invention, discloses adding $CF_4$ or $NF_3$ to silane while depositing silicon oxide, and to creating the plasma using either a single power source or more than one power source having different frequencies, and using magnetron enhanced processing. Foster et al explain that the fluorine-containing gases produce etching during deposition, thereby controlling the sidewall profiles and improving the conformality of the depositing film and reducing the formation of voids. However, the deposition rate was adversely affected by the addition of the fluorine-containing gases.

Another process that has been used to improve the ability of the $SiO_2$ film to adequately fill the gaps between closely spaced apart metal lines comprises an atmospheric pressure (i.e., 760 Torr) CVD method in which TEOS gas is utilized with a source of oxygen gas comprising a mixture of $O_2$ and $O_3$ gases, i.e., an ozone-TEOS precursor gas mixture. This method however, leads to the formation of a silicon oxide film having a high hygroscopicity, which can lead to degradation in the moisture resistance of the final integrated circuit structure, which is not tolerable.

Weise et al, PCT application US92/04103, describes the reaction on an inorganic substrate of unsubstituted silane ($SiH_4$) together with a halogen-containing gas and an oxygen-containing gas by PECVD or ECR CVD techniques. Alternatively the precursor gas can be an organosilane. An etchant is added along with the precursor gas or gases. Suitable etchants listed include fluorine-containing compounds and halogens, but the preferred etchants are HF or $NF_3$. Sulfur-based or carbon-based etchants are not preferred however, because it is stated that residual sulfur or carbon remains in the films, which is undesirable. Halogens are not preferred either, because they corrode the reaction chamber and other equipment. As is well known, $NF_3$ and HF are also corrosive, particularly to quartz parts. The addition of $NF_3$ to the silicon oxide film reduces intrinsic stress in the film, and also reduces the amount of hydrogen present in the film, which has a high dielectric constant. However, this process leads to films having low compressive stress, which leads to semiconductor devices with unsatisfactory electrical properties, and inferior mechanical properties. The process also exhibits low deposition rates.

Thus a method of depositing silicon oxide films on semiconductor substrates, and particularly over submicron conductive metal lines, that is conformal even over submicron lines and spaces, and that is of high quality, but without sacrificing deposition rate unduly, would be highly desirable.

SUMMARY OF THE INVENTION

The present invention is directed to a method of depositing conformal silicon oxide films at high deposition rates that can fill the spaces between closely spaced conductive metal lines without the formation of voids, which films are of high quality. A plasma precursor gas mixture of TEOS and a selected fluorine-containing gas is introduced into a vacuum chamber containing a substrate to be coated that is connected to a source of power. When the power is turned on, a plasma is formed and high quality silicon oxide films deposit on the substrate. The power source may be of a single frequency or multiple power sources having different frequencies can be employed. Different fluorine-containing gas can be employed depending on the apparatus used to deposit the silicon oxide films.

BRIEF DESCRIPTION OF THE DRAWING

FIGS. 1A, 1B, 1C, 1D, 1E and 1F are cross-sectional views of semiconductor devices formed by a prior art PECVD method with the devices having conductive strips of various widths and various spacings using silane as a plasma precursor gas source of silicon.

FIGS. 2A, 2B, 2C, 2D, 2E and 2F are cross-sectional views of semiconductor devices formed by another prior art PECVD method with the devices having conductive strips of various widths and various spacings using TEOS alone as a plasma precursor gas source of silicon.

DETAILED DESCRIPTION OF THE INVENTION

In one embodiment of the present invention, a plasma is created within a reaction chamber by means of two electrical power sources having different frequencies. A high frequency of about 13.56 MHz and a low frequency of between about 50 KHz and about 1000 KHz, preferably about 400 KHz, are used. A reaction gas comprising a mixture of TEOS and a halogen gas selected from a fluorine, a chlorine or a bromine gas, is introduced into the reaction chamber and subjected to the plasma. The ratio of the TEOS to halogen can vary. Increasing the amount of halogen gas decreases the deposition rate, which can be from about 4800 to about 6000 angstroms per minute. Thus a ratio of about 1:1 for TEOS to halogen is preferred for this embodiment. Suitable fluorine-containing gases include $CF_4$, $C_2F_6$, $NF_3$, $CHF_3$, $CH_2F_2$, $F_2$, $SF_6$ and the like. Suitable chlorine-containing gases include $CCl_4$, $Cl_2$, HCl and the like. Suitable bromine-containing gases include HBr and the like.

The thin film deposited by the above method when deposited over conductive strips has been found to have a smooth, tapering configuration, with no voids even at very small widths of the conductive strips and at submicron spacings. Also, since the sidewalls of the deposited layer have superior fineness, the above method is superior in terms of the control it affords over film quality. In addition, when the film is formed using a fluorine-containing gas, the deposited layer also includes fluorine. This fluorine in an insulating film of silicon dioxide lowers the dielectric constant of the film, which in turn enhances the electrical properties of any transistors formed using the method of the present invention. The silicon oxide films of the invention are stable in the presence of moisture.

Figure 3:
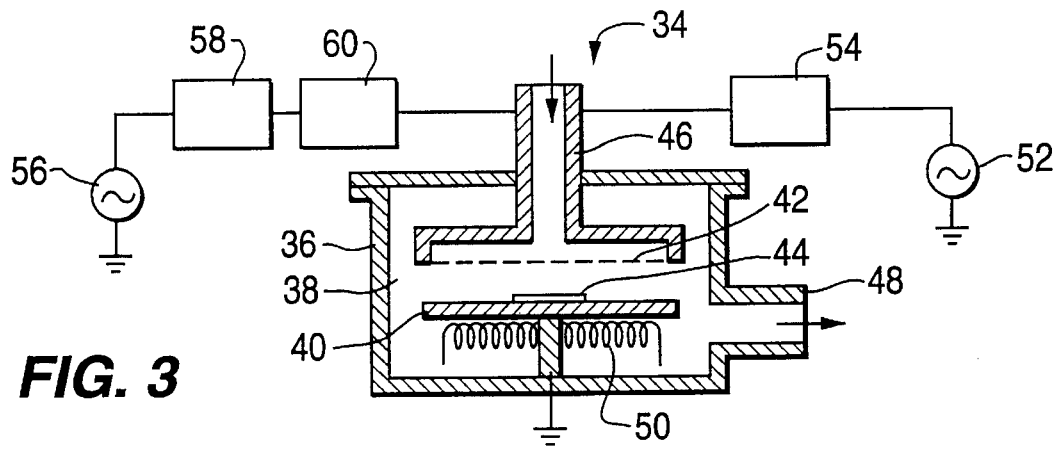
FIG. 3 is a schematic sectional view of one form of a deposition apparatus having multiple power sources which can be used to carry out the method of the present invention.

Referring now to FIG. 3, there is shown one type of a deposition apparatus 34 which can be used to carry out the method of the present invention. The deposition apparatus 34 comprises an insulated deposition vessel 36 having an airtight reaction chamber 38. A pair of electrodes 40 and 42 are in spaced, substantially parallel relation within the reaction chamber 38. The electrode 40 serves as a support for a body 44, such as a semiconductor substrate, on which a coating is to be deposited, and is connected to ground potential. The electrode 42 has an inlet tube 46 extending therefrom and out of the vessel 36 through which a reaction gas can be admitted into the reaction chamber 38. An outlet tube 48 extends from a wall of the reaction vessel 36 to permit gases to be exhausted from the reaction chamber 38. A heater 50 is provided along the electrode 40 to control the temperature of the body 44 during deposition.

The electrode 42 is connected to a first power source 52 for providing a high frequency, typically about 13.56 MHz, oscillation to the electrode 42. An impedance matching circuit 54 is provided between the high frequency power source 52 and the electrode 42. The electrode 42 is also connected to a second power source 56 for providing a lower frequency, typically about 400 KHz, oscillation to the electrode 42. Between the low frequency power source 56 and the electrode 42 are an impedance matching circuit 58 and a high frequency cut-off filter circuit 60 for blocking the passage of any high frequency components. By simultaneously applying to the electrode 42 electrical power of two different frequencies, i.e., high and low frequencies, a plasma is created within the reaction chamber 38.

To deposit a layer of a material, such as silicon dioxide, on the surface of a body 44, such as a semiconductor substrate, in the apparatus 34 using the method of the present invention, the body 44 is placed in the chamber 38 and on the electrode 40. A reaction gas of a mixture of a fluorine gas, such as $NF_3$, and TEOS gas is introduced into the chamber 38 through the inlet tube 46. The power sources 52 and 56 are turned on to simultaneously provide a high frequency power and a lower frequency power to the electrodes 40 and 42. The ratio between the power outputs from the high frequency source 52 and the lower frequency source 56 is suitably adjusted to form a plasma within the chamber 38 and between the electrodes 40 and 42. The reaction gas is subjected to the plasma, causing the reaction gas to react and deposit a thin film of silicon oxide on the exposed surface of the body 44.

Referring to FIGS. 4A to 4F, there are shown sectional views of semiconductor devices 62a to 62f formed by the method of the present invention in an apparatus 34 described above. Each of the semiconductor devices 62a to 62f comprises a semiconductor substrate 64a to 64f, typically of silicon, having on a surface 66a to 66f thereof a layer 68a to 68f of silicon dioxide. On the silicon dioxide layer 68a to 68f are a plurality of spaced, substantially parallel strips 70a to 70f of aluminum. The aluminum strips 70a to 70f are similar to the conductive wiring of an integrated circuit. A layer 72a to 72f of silicon dioxide is coated over the aluminum strips 70a to 70f and the surface of the silicon dioxide layers 68a to 68f between the aluminum strips 70a to 70f. The aluminum strips 70a to 70f vary in width and spacing, with the aluminum strips 70a in FIG. 4A being the widest and having the widest spacing therebetween, and the aluminum steps 70f in FIG. 4F being the narrowest and being the most closely spaced.

The silicon dioxide layers 72a to 72f were deposited over the aluminum strips 70a to 70f by the above described method. For this method, the pressure in the reaction chamber 38 was 5 Torr, and the spacing between the electrodes 40 and 42 was 250 mils. A flow of TEOS and a helium carrier gas at 480 sccm was provided in the reaction chamber 38. A flow of $C_2F_6$ at 400 sccm and a flow of oxygen at 700 sccm was also provided in the reaction chamber 38. A high frequency of 13.56 MHz at a power of 80 watts was applied to the electrode 42, and a low frequency of 400 KHz at a power of 90 watts was also applied to the electrode 42.

Figure 4A:
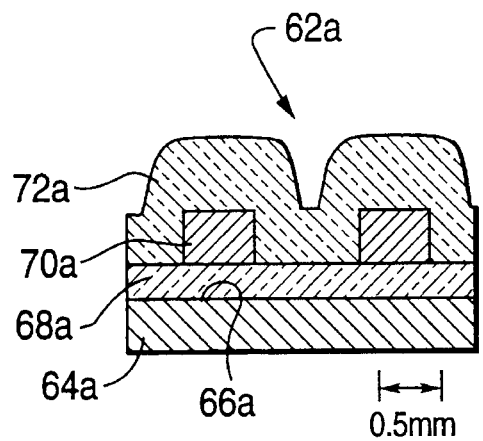
FIGS. 4A, 4B, 4C, 4D, 4E and 4F are cross-sectional views of semiconductor devices formed by PECVD using a power source having multiple frequencies with the devices having conductive strips of various widths and various spacings in accordance with the present invention.
Figure 4B:
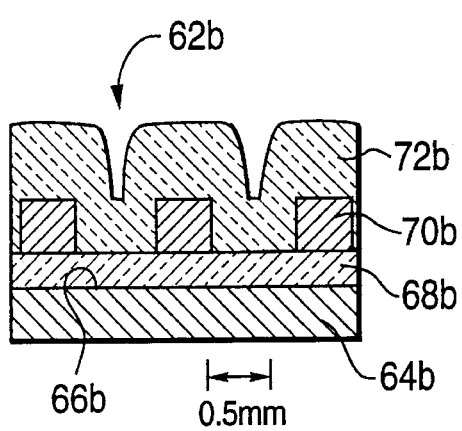
Figure 4C:
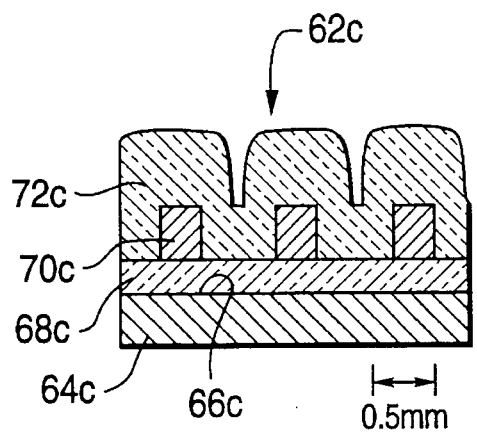
Figure 4D:
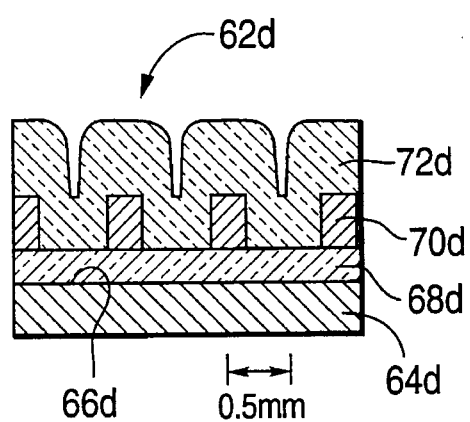
Figure 4E:
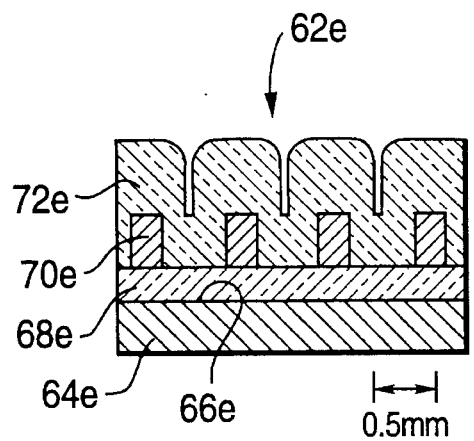
Figure 4F:
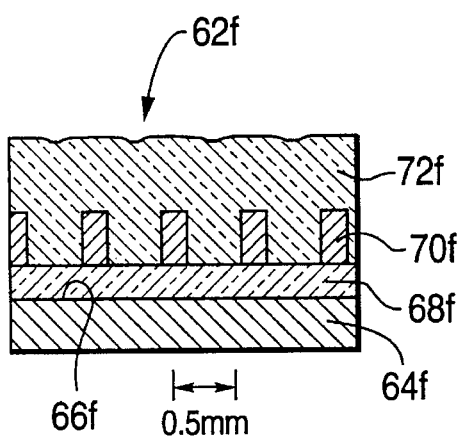
Figure 7A:
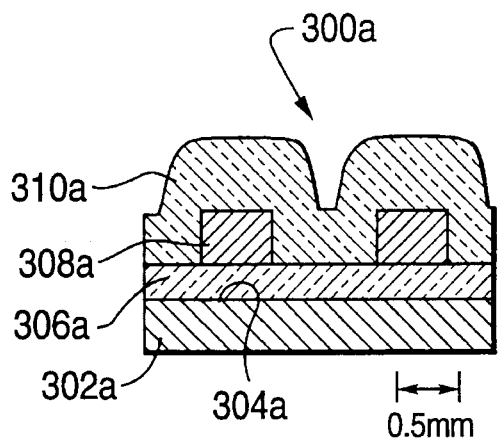
FIGS. 7A, 7B, 7C, 7D, 7E and 7F are cross-sectional views of semiconductor devices formed by PECVD using a power source of a single frequency with the devices having conductive strips of various widths and various spacings in accordance with the present invention.
Figure 7B:
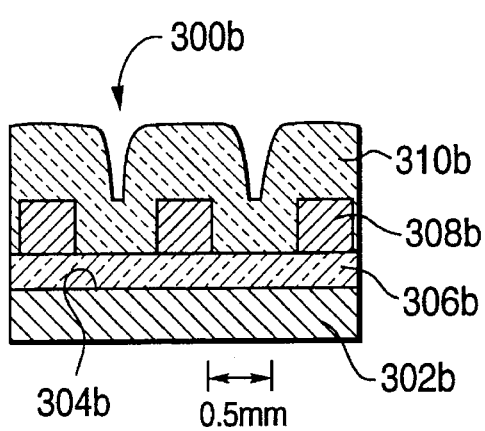
Figure 7C:
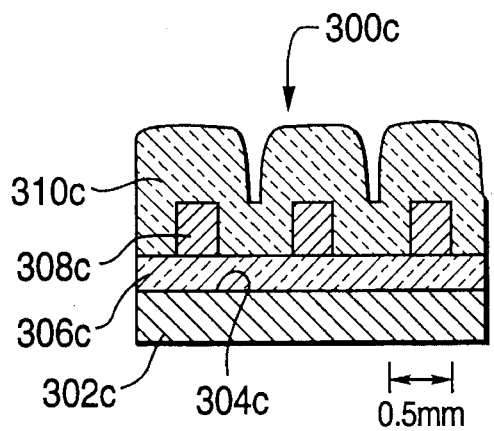
Figure 7D:
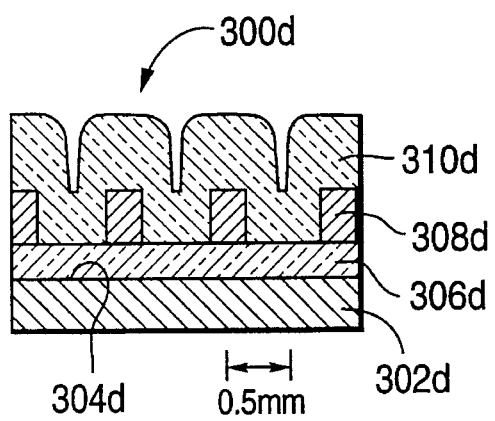
Figure 7E:
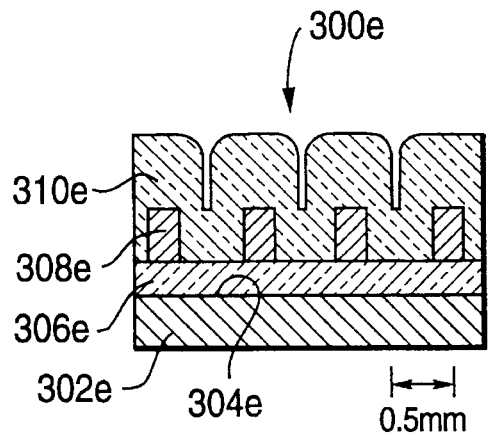
Figure 7F:
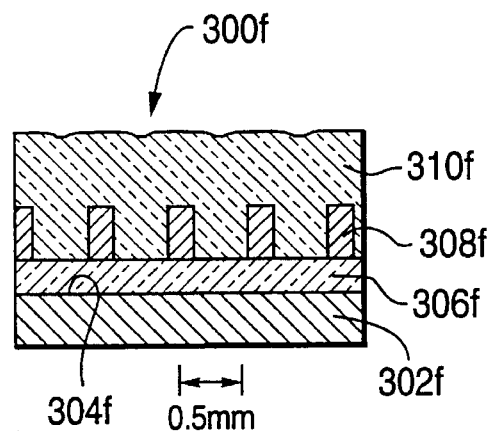

When the widths of the respective aluminum strips and of the corresponding spaces between the strips are comparatively large, as shown in FIGS. 4A to 4D, the sidewalls of the silicon dioxide layers 72a to 72d have a smoothly tapered configuration. However, even when the widths of the respective aluminum strips and of the corresponding spaces between the strips is in the submicron range, as shown in FIG. 4E, the sidewall configuration of the silicon dioxide layer 72e is straight, and the possible creation of voids is greatly reduced. When the width of the respective aluminum strips and the corresponding spaces therebetween is reduced even further, in the submicron range, as shown in FIG. 4F, the spaces between the aluminum strips 70f are buried by the silicon oxide layer 78f, without the formation of any voids in the film. Since the sidewalls obtained with the configurations shown in FIGS. 4E and 4F have a fine compositional structure, an enhancement of the quality is achieved. The compressive stress of the above film was found to be $1\times10^9$ dynes/cm$^2$.

Although applicants are not to be bound by any theory, it is believed that the reason that voids are reduced and that the walls of the silicon oxide thin films deposited by the above-described method have a tapered configuration is that at the same time that the deposit is formed on the upper surface of the aluminum strips, the deposited thin film is subjected to etching by the halogen-containing gas that smooths the sidewalls. In addition, when the deposited silicon oxide film includes fluorine, the dielectric constant of the silicon oxide is lowered. Thus, in cases such as those wherein the aluminum strips are used as wiring between gates of MOSFETs for the purpose of connecting the gate electrodes of MOSFETs, it is possible to realize a MOSFET with good electrical characteristics.

Figure 5:
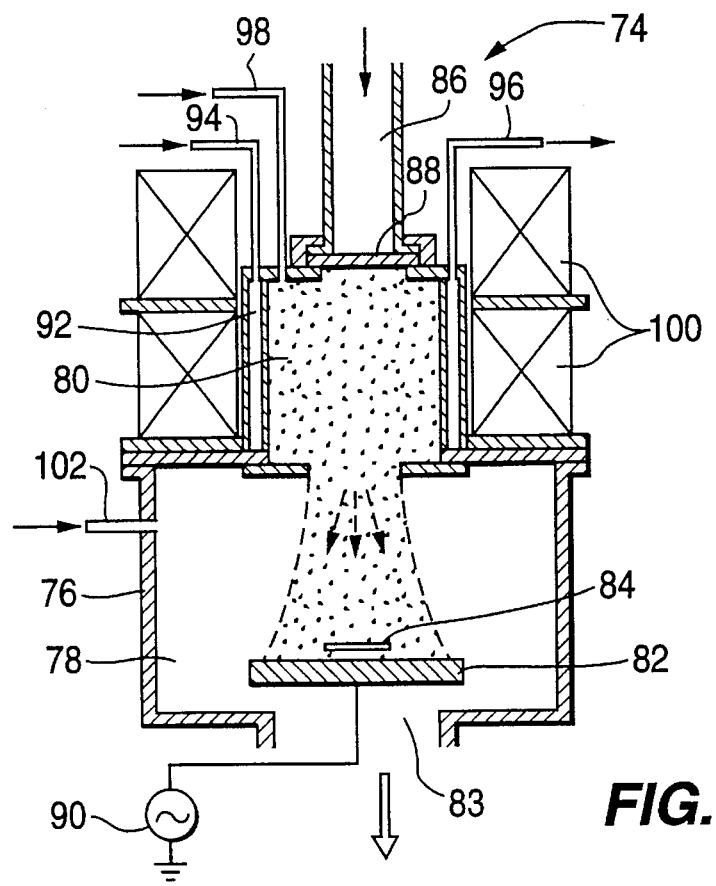
FIG. 5 is a schematic sectional view of another form of a deposition apparatus having multiple power sources which can be used to carry out the method of the present invention.

Referring to FIG. 5, there is shown another apparatus 74 which can be used to carry out the method of the present invention. Apparatus 74 is an ECR plasma CVD device and comprises a reaction vessel 76 having a deposition chamber 78 and a plasma creation chamber 80 over and opening into the deposition chamber 78. An electrode 82 is within the deposition chamber 78 and is adapted to support a body 84, such as a semiconductor substrate to be coated. A microwave wave guide tube 86 extends to the top of the plasma creation chamber 80 and is mounted on a window 88 over an opening in the plasma creation chamber 80. The wave guide tube 86 is adapted to deliver microwave power, typically about 2.45 GHz, to the plasma creation chamber 80. The electrode 82 is connected to a high frequency, typically about 13.56 MHz, power source 90.

A cooling chamber 92 surrounds the plasma creation chamber 80. Inlet and outlet pipes 94 and 96 respectively extend into and away from the cooling chamber 92 and are adapted to provide a flow of a cooling fluid through the cooling chamber 92. A gas inlet tube 98 extends into the plasma creation chamber 80 and is adapted to deliver a plasma forming gas into the plasma creation chamber 80. A gas inlet tube 102 extends into the deposition chamber 78 and a gas exhaust opening 83 is also in the deposition chamber 78.

To carry out the method of the present invention in the apparatus 74, a body 84 to be coated is placed on the electrode 82. The microwave power is fed into the plasma forming chamber 80 simultaneously with the high frequency power being applied to the electrode 82. A plasma forming gas is fed into the plasma forming chamber 80 where a plasma is formed by the application of the two powers of different frequencies. The plasma is drawn from the plasma forming chamber 80 into the deposition chamber 78. The reaction gas, a mixture of TEOS and a halogen-containing gas, is fed into the vessel 76 where it is reacted by the plasma to form silicon oxide which deposits on the surface of the body 84.

Figure 6:
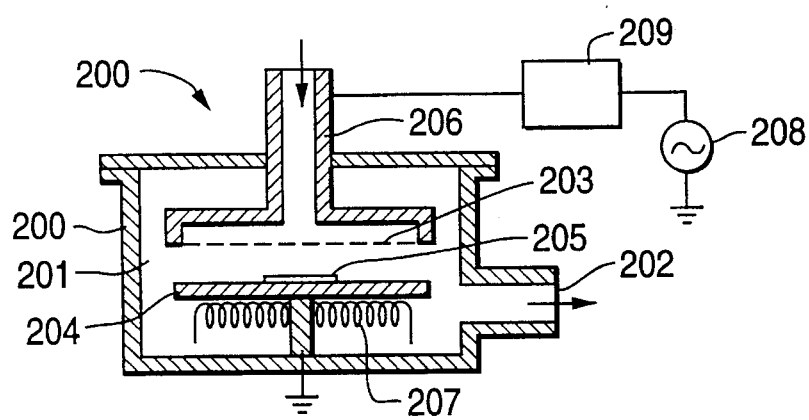
FIG. 6 is a schematic sectional view of a deposition apparatus having a single power source which can be used to carry out the meethod of the present invention.

In addition, the present method can also be carried out using only a single frequency power source for forming a plasma between the electrodes, as shown in FIG. 6.

The apparatus of FIG. 6 is similar to the apparatus of FIG. 3, except that only a single power source is employed. Referring to the deposition apparatus 200 of FIG. 6, an airtight reaction chamber 201 includes a pair of electrodes 203 and 204 spaced apart and substantially parallel to each other. The electrode 204 serves as a support for a body 205 to be coated. The electrode 203 has an inlet tube 206 extending from the reaction chamber 201 for the introduction of reaction gases. An exhaust port 202 also extends from a wall of the chamber 201 to permit gases to be exhausted from the chamber 201. A heater 207 is provided along the electrode 204 to control the temperature of the body 205 during deposition.

The electrode 203 is connected to a power source 208 for providing a high frequency, typically 13.56 MHz, oscillation to the electrode 203. An impedance matching circuit 209 is provided between the high frequency power source 208 and the electrode 203.

A silicon oxide film was deposited in accordance with the present invention using the apparatus of FIG. 6, maintaining a pressure of 5 Torr in the chamber, a spacing between the electrodes of 250 mils, a flow of vaporized TEOS (480 sccm) adding oxygen gas at a ratio of TEOS:$O_2$ of 1:10, and $C_2F_6$ as the halogen additive gas at a flow rate such that the volume ratio of $O_2$:$C_2F_6$ is 3:1. TEOS was vaporized by passing a carrier gas, such as helium, through a heated liquid TEOS resevoir. A carrier gas flow of 400 sccm of helium passed into the resevoir will pick up about 80 sccm of TEOS. Thus a 480 sccm gas flow will be measured for the TEOS flowing into the reaction chamber. Thus about 5 parts by volume of carrier has per volume of TEOS vapor will flow into the reaction chamber.

Referring to FIGS. 7A to 7F, there are shown sectional views of semiconductor devices 300a to 300f comprising a semiconductor substrate 302a to 302f, typically of silicon, having on a surface 304a to 304f thereof a layer 306a to 306f of silicon oxide. On the silicon oxide layers 306a to 306f are a plurality of spaced, substantially parallel strips 308a to 308f of aluminum. The aluminum strips 308a to 308f are similar to conductirve wiring for an integrated circuit. A layer 310a to 310f of silicon oxide deposited in accordance with the invention is coated over the aluminum strips 308a to 308f and the surface of the silicon oxide layers 310a to 310f between the aluminum strips 308a to 308f. The aluminum strips 308a to 308f vary in width and spacing as in FIGS. 4A to 4F.

The silicon oxide layers 310a to 310f were deposited over the aluminum strips 308a to 308f in the reaction chamber of FIG. 6 in similar fashion, i.e., same gases and gas flows and reaction conditions, to the films deposited as shown in FIGS. 4A to 4F, except that only a single power source having a frequency of 13.56 MHz was employed.

It is apparent that no voids were formed in the silicon oxide films 310a to 310f.

The silicon oxide film obtained contained about 4.3% of fluorine. In this case, using a single frequency, the deposition rate of the silicon oxide was reduced to about 2500–3000 angstroms per minute. The compressive stress of this film was about $2 \times 10^8$ dynes/$cm^2$.

Figure 8A:
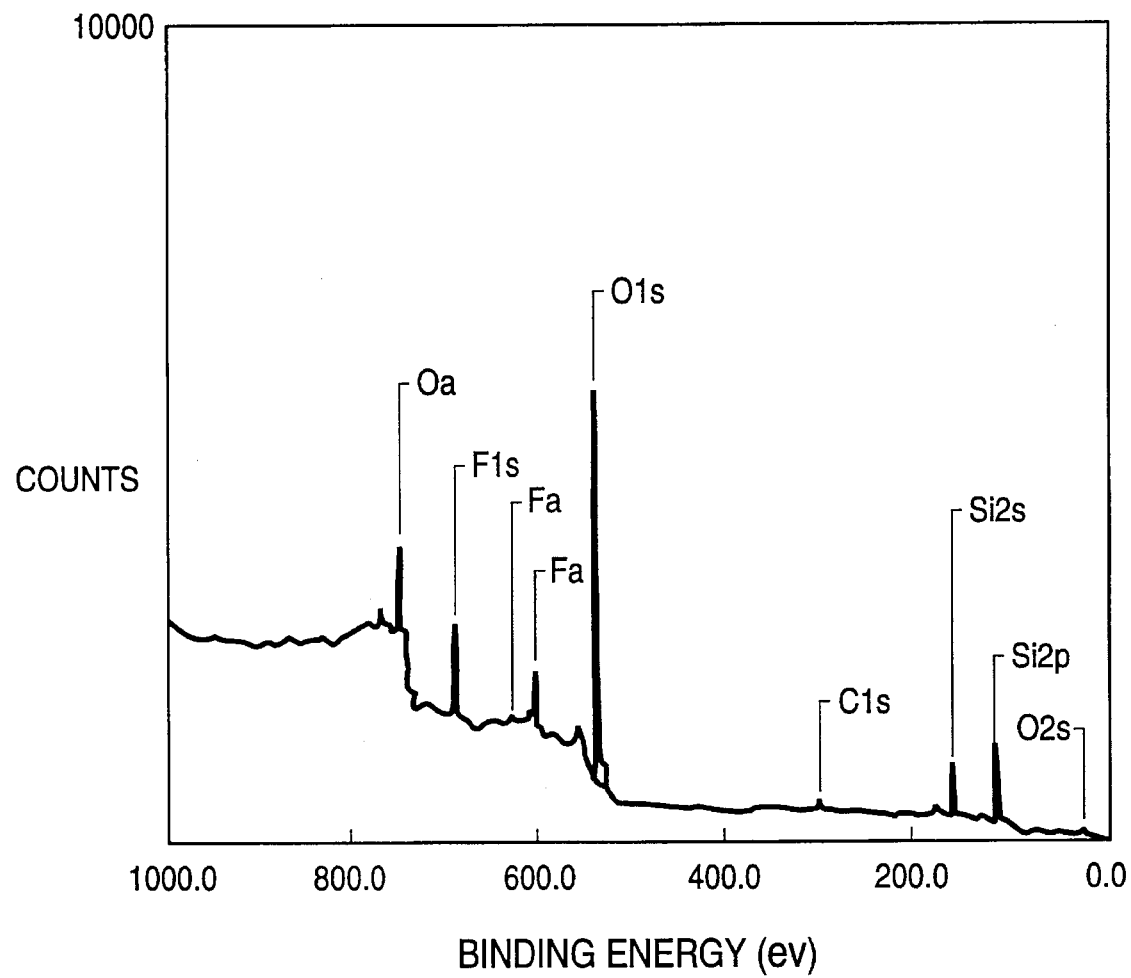
FIG. 8A is an X-ray photoelectron spectrum (XPS) graph of a silicon oxide layer deposited in accordance with the present invention.
Figure 8B:
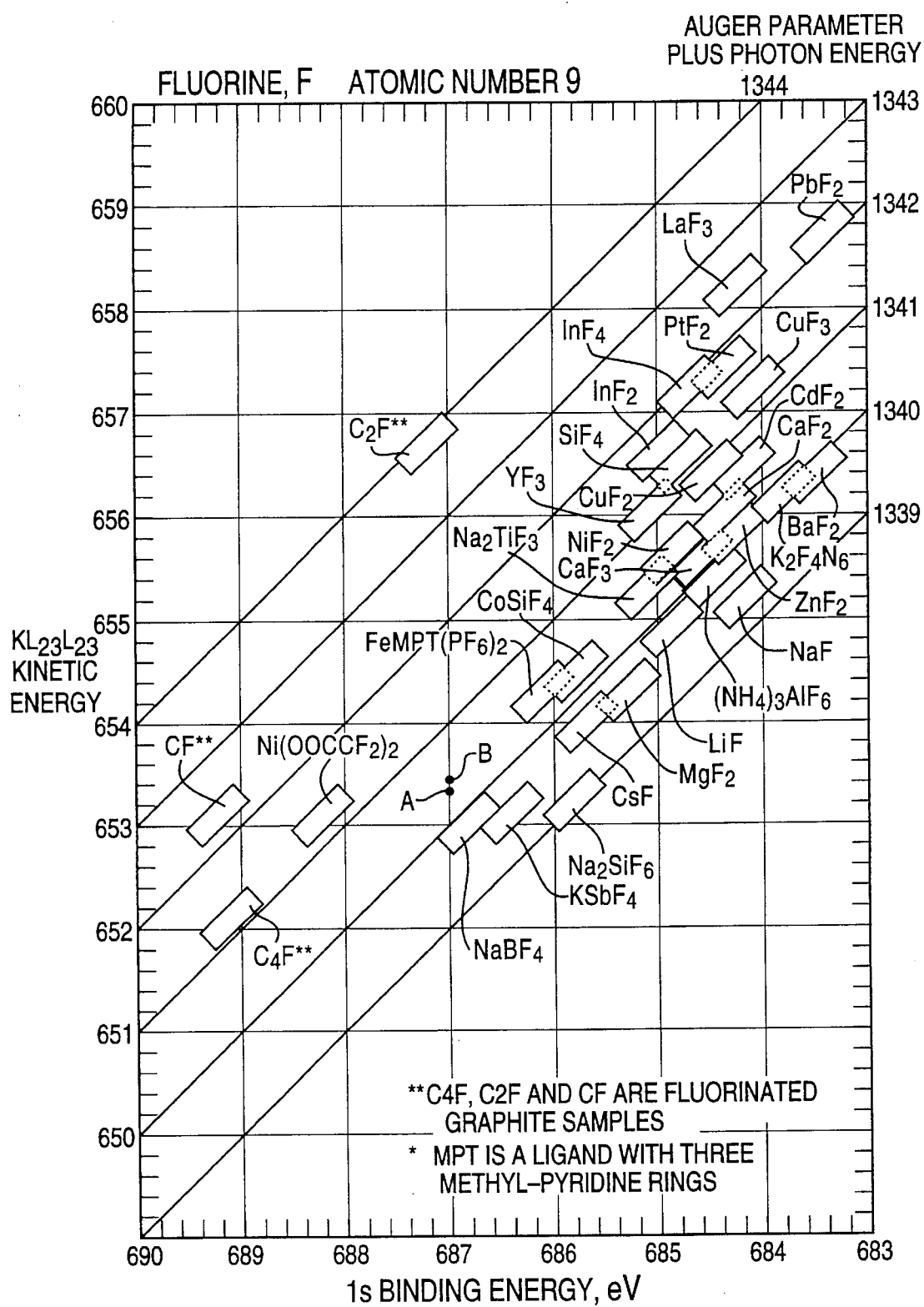
FIG. 8B is a graph of 1s binding energy for fluorine showing inorganic fluorine bonds.

FIG. 8A is a graph of an XPS of the above film. The binding energy is depicted for oxygen, fluorine and silicon. The fluorine 1s level at about 687 show that the fluorine is bonded to an inorganic element, such as Si—F, rather than an organic bond such as C—F—C. FIG. 8B is a graph of 1s binding energy for fluorine, as set forth in "Handbook of X-ray Photoelectron Spectroscopy" of Perkin-Elmer Company. This shows two points, "A" and "B". "A" is the binding energy of fluorine obtained for the silicon oxide film made by the above process at a concentration of 4.3 atomic percent of fluorine; and "B" is the binding energy of fluorine obtained for a silicon oxide film made by the above process at a concentration of 7.3 atomic percent of fluorine. These points are both below the kinetic energy line 651, as is a known Si—F compound, CoSiF. The 1s binding energy of fluorine for an organic or polymeric C—F bond is much higher—at the 654 line. Thus both samples "A" and "B" show the fluorine in the silicon oxide film is present as an inorganic bond, e.g., bonded to silicon, rather than an organic bond, e.g., bonded to carbon.

When the above method of preparing silicon oxide from TEOS was repeated except using $NF_3$ as the halogen source, poor deposition profiles were obtained. Thus when only a single frequency power source apparatus is employed, halocarbons having the formulas

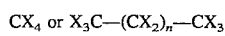

$$CX_4 \text{ or } X_3C-(CX_2)_n-CX_3$$

wherein X is hydrogen or halogen, with the proviso that at least one halogen is present, and n is an integer of 0 to 5, are employed. However, fluorocarbons, such as $C_2F_6$ or $CF_4$ and the like, are the halogens of choice.

As the fluorine content of the silicon oxide film deposited in accordance with the invention increases, the dielectric constant of the films is reduced, improving the electrical properties of the film. Higher fluorine-containing gas flow rates during deposition also improve the gap filling capability of the silicon oxide films and increase the wet etch rate, while reducing the deposition rate and refractive index (R.I.).

The application of low frequency power decreases the deposition rate, but improves compressive stress, slightly increases the wet etch rate, lowers R.I. and increases the gap filling capability. The application of high frequency power slightly reduces the deposition rate, does not affect the compressive stress of the films, slightly increases the wet etch rate, slightly decreases the R.I. and slightly increases the gap filling capability.

Thus, in order to maximize the deposition rate, silicon oxide film quality, and obtain conformal, low dielectric constant silicon oxide films, it is preferred that the concentration of fluorine in the film be about 2.5 atomic percent or higher.

Figure 9:
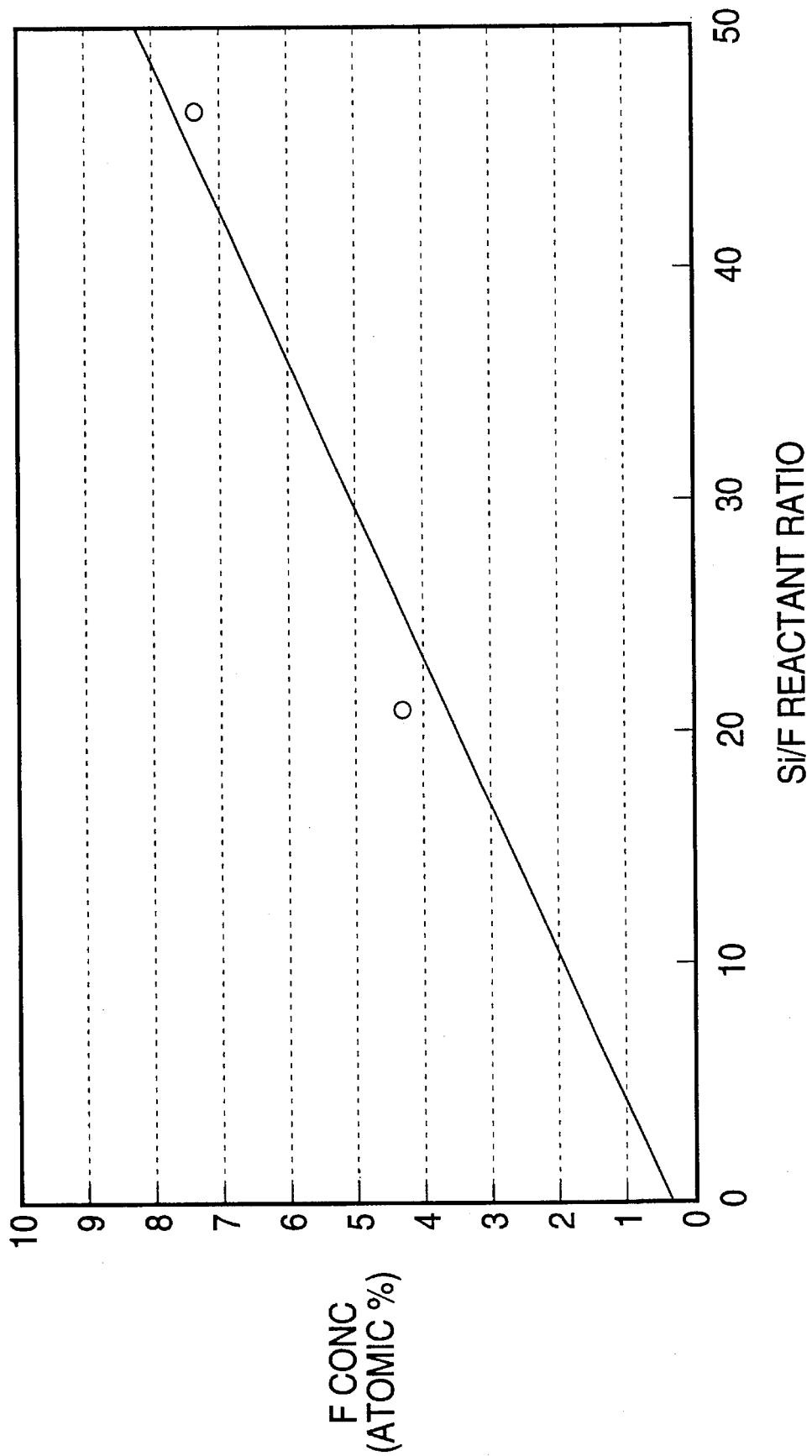
FIG. 9 is a graph of fluorine concentration in a silicon oxide film of the invention versus the Si/F reactant ratio.

FIG. 9 is a graph of fluorine concentration in atomic percent versus Si/F reactant ratio of TEOS:F-containing gas. Thus if the desired atomic percentage of fluorine in the silicon oxide film is 2.5 atomic percent, the Si/F reactant ratio should be about 14:1.

Figure 10:
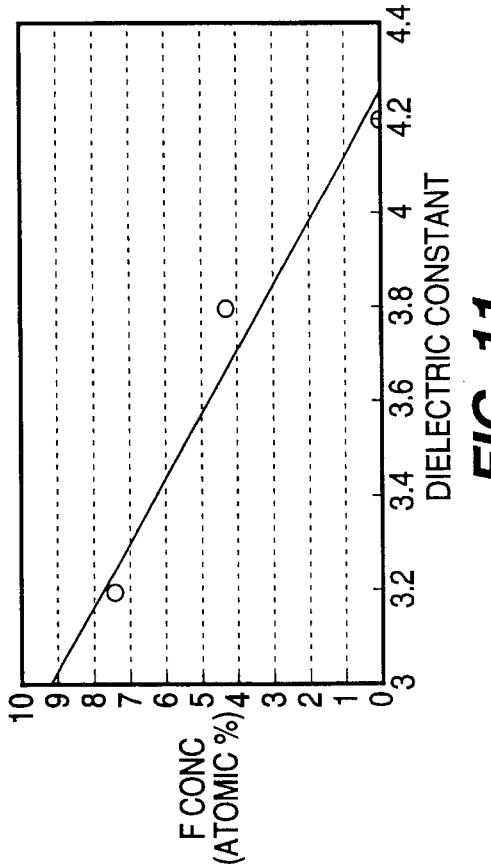
FIG. 10 is a graph of fluorine concentration in atomic percent of silicon oxide films of the invention versus $C_2F_6$ gas flow using TEOS as the reactant gas.

FIG. 10 is a graph of fluorine concentration in atomic percent versus $C_2F_6$ gas flow. For a film containing 2.5 atomic percent of fluorine, the $C_2F_6$ gas flow rate should be about 125 sccm.

Figure 11:
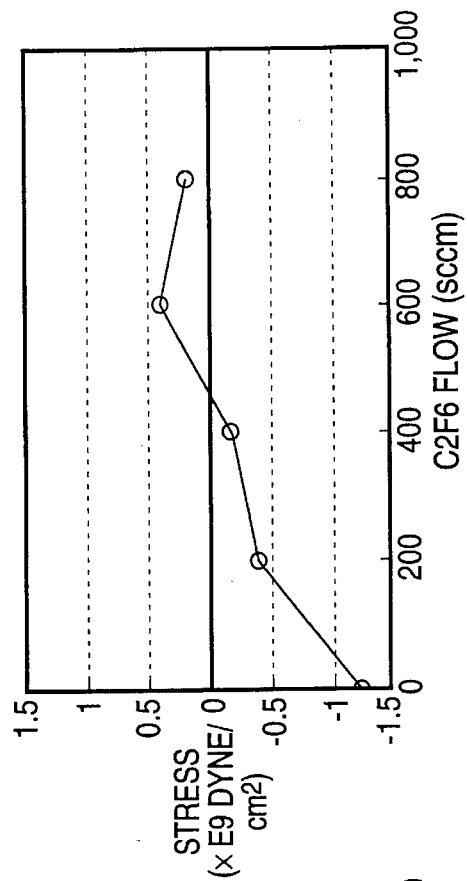
FIG. 11 is a graph of fluorine concentration in atomic percent of silicon oxide films of the invention versus dielectric constant.

FIG. 11 is a graph of dielectric constant versus fluorine concentration in the silicon oxide film. It can be seen that as fluorine concentration rises, dielectric constant is lowered.

Figure 12:
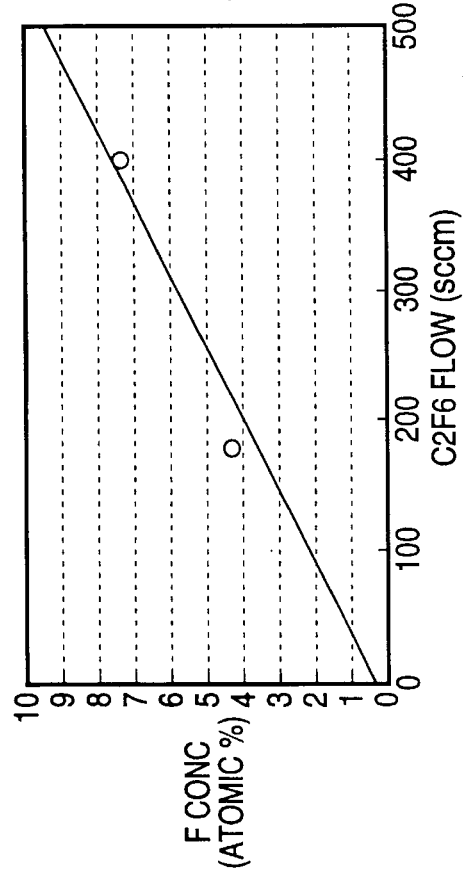
FIG. 12 is a graph of wet etch rate versus $C_2F_6$ gas flow using TEOS as the reactant gas for silicon oxide films of the invention.

FIG. 12 is a graph of the wet etch rate of a silicon oxide film versus $C_2F_6$ flow rates, illustrating that there is an increase in wet etch rate as fluorine concentration increases to a maximum level.

Figure 13:
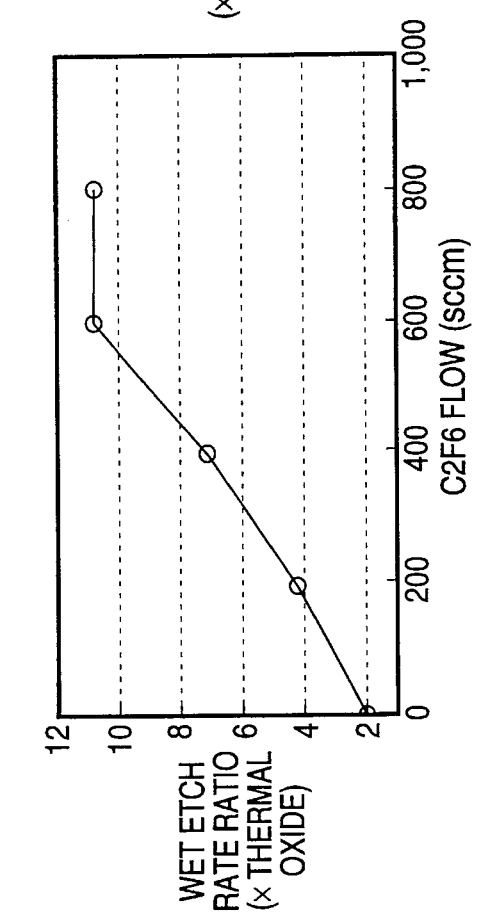
FIG. 13 is a graph of stress versus $C_2F_6$ gas flow using TEOS as the reactant gas for silicon oxide films of the invention.

FIG. 13 is a graph of $C_2F_6$ flow rate versus stress of the silicon oxide films, showing reduced stress with higher $C_2F_6$ flow rates and higher fluorine concentration in the films.

We have found that an optimum ratio of silicon to fluorine of about 14:1 in the precursor gases is preferred in our process to minimize formation of voids over submicron lines and spaces, and to maximize the physical and electrical properties of the film, without unduly sacrificing deposition rates. The resultant film contains about 2.5 atomic percent of fluorine.

Although the present invention has been described in terms of specific embodiments, the invention is only meant to be limited by the scope of the appended claims. Various changes in the processing parameters, plasma precursor gases and equipment can be made as will be well known to one skilled in the art.

We claim:

1. A method of forming a conformal thin film of silicon oxide on a substrate having spaced conductive lines thereon comprising the steps of:

mounting a substrate onto a substrate support in a vacuum chamber;

forming a plasma in the vacuum chamber in a region above the substrate by means of an electrical power source from a reaction gas comprising a mixture of tetraethylorthosilicate and a fluorine-containing halocarbon gas selected from the group consisting of $CX_4$ and $CX_3-(CX_2)_n-CX_3$ wherein X is hydrogen or halogen and n is an integer from 0 to 5 with the proviso that at least one X is fluorine; and subjecting the substrate to the plasma so as to deposit a layer of silicon oxide containing at least about 2.5 atomic percent of fluorine onto the substrate without the formation of voids in the film.

2. The method of claim 1 wherein the plasma is created from the tetraethylorthosilicate and $C_2F_6$.

3. The method of claim 1 wherein the plasma is created by means of two power sources having different frequencies.

4. The method of claim 3 wherein the plasma is created by means of one power source having a frequency of about 13.56 MHz and a second power source having a frequency of between 50 KHz and 1000 KHz.

5. The method of claim 4 wherein the second power source has a frequency of about 400 KHz.

6. The method of claim 1 wherein a single power source having a frequency of about 13.56 MHz is used.

7. The method of claim 1 wherein said power source is a source of microwave power.

8. A method of forming a conformal thin film of silicon oxide over a substrate having spaced conductive lines thereon in a plasma chamber comprising mounting a substrate in said chamber;

introducing into the chamber in a region above said substrate as a plasma precursor gas vaporized tetraethylorthosilicate in a carrier gas including oxygen and a fluorocarbon selected from the group consisting of $$CX_4 \text{ and } CX_3-(CX_2)_n-CX_3$$

wherein X is hydrogen or fluorine and n is an integer from 0 to 5 with the proviso that at least one X is fluorine;

and thereafter forming a plasma therefrom, so as to deposit a layer of silicon oxide containing at least about 2.5 atomic percent of fluorine over said conductive lines.

9. A method according to claim 8 wherein the plasma precursor gas contains a ratio of silicon:fluorine of about 14:1.

10. A method according to claim 8 wherein the conductive lines are less than 1 micron in width and no more than 1 micron apart.

* * * * *